(12) United States Patent
Fujita (10) Patent No.: US 8,947,918 B2
(45) Date of Patent: Feb. 3, 2015

(54) SEMICONDUCTOR MEMORY DEVICE

(71) Applicant: Katsuyuki Fujita, Seoul (KR)

(72) Inventor: Katsuyuki Fujita, Seoul (KR)

( * ) Notice: Subject to any disclaimer, the term of this patent is extended or adjusted under 35 U.S.C. 154(b) by 0 days.

(21) Appl. No.: 14/014,231

(22) Filed: Aug. 29, 2013

(65) Prior Publication Data

US 2014/0286087 A1 Sep. 25, 2014

Related U.S. Application Data

(60) Provisional application No. 61/804,455, filed on Mar. 22, 2013.

(51) Int. Cl.
*G11C 11/16* (2006.01)

(52) U.S. Cl.
CPC ........ *G11C 11/1673* (2013.01); *G11C 11/1675* (2013.01)
USPC ........... 365/158; 365/189.05; 710/6; 711/169

(58) Field of Classification Search
USPC ............ 365/148, 158, 163, 171, 173, 189.04, 365/189.05, 220; 710/5, 6, 39, 52, 59; 711/168, 169
See application file for complete search history.

(56) References Cited

U.S. PATENT DOCUMENTS

| | | | | |
|---|---|---|---|---|
| 5,742,792 | A * | 4/1998 | Yanai et al. | 711/162 |
| 7,818,651 | B2 * | 10/2010 | Nagai et al. | 714/762 |
| 8,375,163 | B1 * | 2/2013 | Edmondson et al. | 711/105 |
| 2009/0010044 | A1 | 1/2009 | Sakimura et al. | |
| 2010/0306423 | A1 | 12/2010 | Hashimoto | |

FOREIGN PATENT DOCUMENTS

JP 2012-084218 A 4/2012

* cited by examiner

*Primary Examiner* — Harry W Byrne
*Assistant Examiner* — Lance Reidlinger
(74) *Attorney, Agent, or Firm* — Holtz, Holtz, Goodman & Chick PC (57) ABSTRACT

According to one embodiment, a semiconductor memory device includes a memory cell array, a buffer configured to hold data input to an input/output circuit and to hold data read from the memory cell array, and a controller configured to receive a first command and an address from the outside and to read data, in response to the first command, from a memory cell group coupled to a selected word line designated by the address to the buffer. The controller receives a second command which is input after the first command and indicates a last command of a group of commands including write commands and/or read commands, and starts a write operation from the buffer to the memory cell array in response to the second command.

13 Claims, 10 Drawing Sheets

SEMICONDUCTOR MEMORY DEVICE

CROSS-REFERENCE TO RELATED APPLICATIONS

This application claims the benefit of U.S. Provisional Application No. 61/804,455, filed Mar. 22, 2013, the entire contents of which are incorporated herein by reference.

FIELD

Embodiments described herein relate generally to a semiconductor memory device.

BACKGROUND

A magnetic random access memory (MRAM) is a memory device using a magnetic element having a magnetoresistive effect as a memory cell to store data. The MRAM has captured much attention as a next-generation memory device due to its fast operation, large capacity and nonvolatility. Research and development have been carried out on the MRAM as an alternative to volatile memories such as a DRAM and SRAM. Naturally, operating the MRAM with the same specs as the DRAM or SRAM is preferable in order to minimize the development cost and to achieve smooth replacement.

DETAILED DESCRIPTION

In general, according to one embodiment, there is provided a semiconductor memory device comprising:

a memory cell array comprising memory cells;

word lines coupled to rows of the memory cell array;

bit lines coupled to columns of the memory cell array;

an input/output circuit configured to receive data from the outside and to output data to the outside;

a buffer configured to hold data input to the input/output circuit and to hold data read from the memory cell array via the bit lines; and a controller configured to receive a first command and an address from the outside and to read data, in response to the first command, from a memory cell group coupled to a selected word line designated by the address to the buffer, wherein the controller receives a second command which is input after the first command and indicates a last command of a group of commands including write commands and/or read commands, and the controller starts a write operation from the buffer to the memory cell array in response to the second command.

In the following, the embodiments of the present invention will be explained with reference to the drawings. In the following explanation, the same reference numbers are used for elements having the same functions and structures to avoid redundant explanations.

In the following embodiments disclosed herein, an MRAM will be explained as an example of a semiconductor memory device.

First Embodiment

1. Configuration of MRAM

Figure 1:
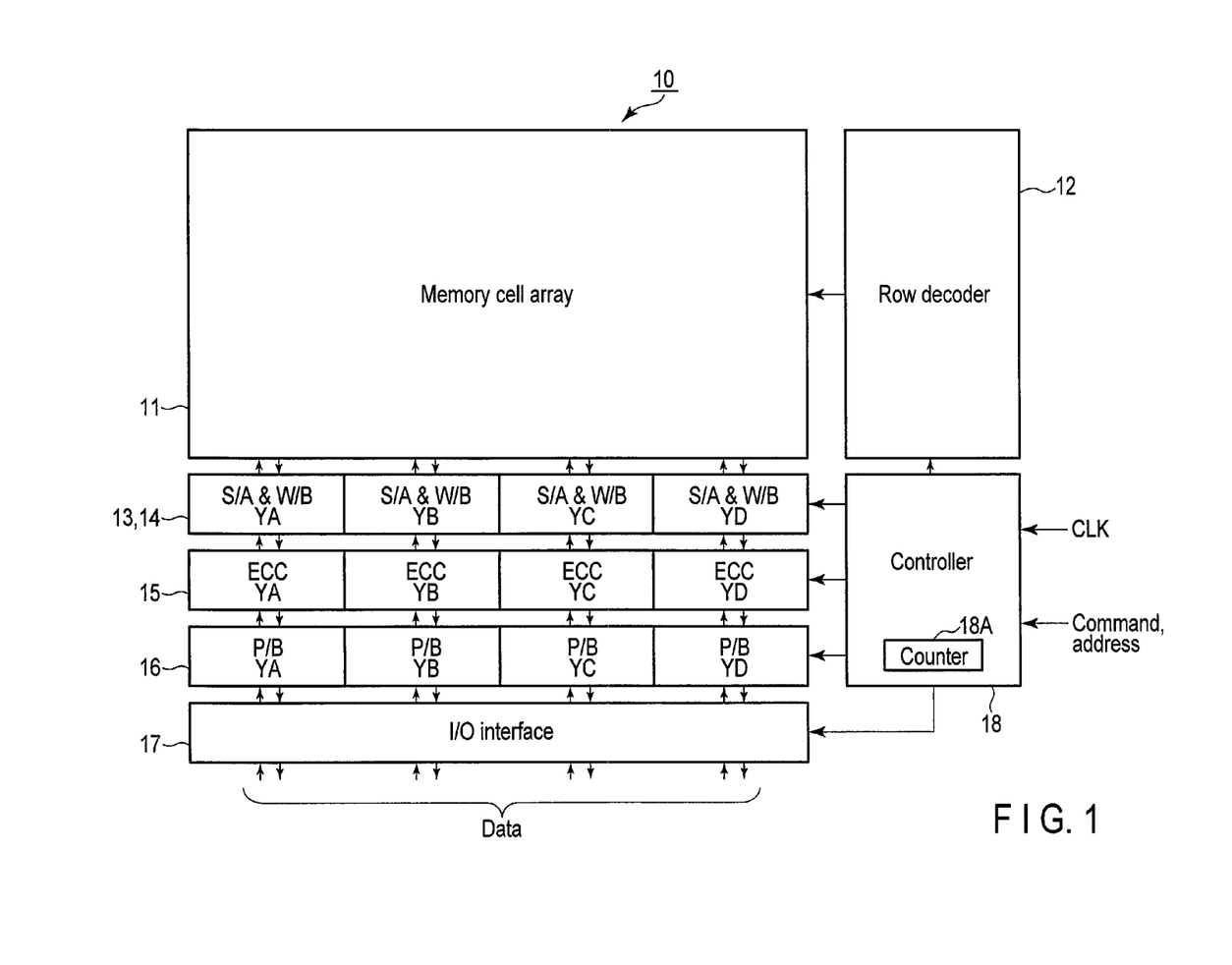
FIG. 1 is a block diagram of an MRAM.

FIG. 1 is a block diagram of an MRAM 10 according to the first embodiment. The MRAM 10 comprises a memory cell array 11, a row decoder 12, a sense amplifier (S/A) 13 as a read circuit, a write buffer (W/B) 14 as a write circuit, an error checking and correcting (ECC) circuit 15, a page buffer (P/B) 16, an input/output interface circuit 17, and a controller 18.

Figure 2:
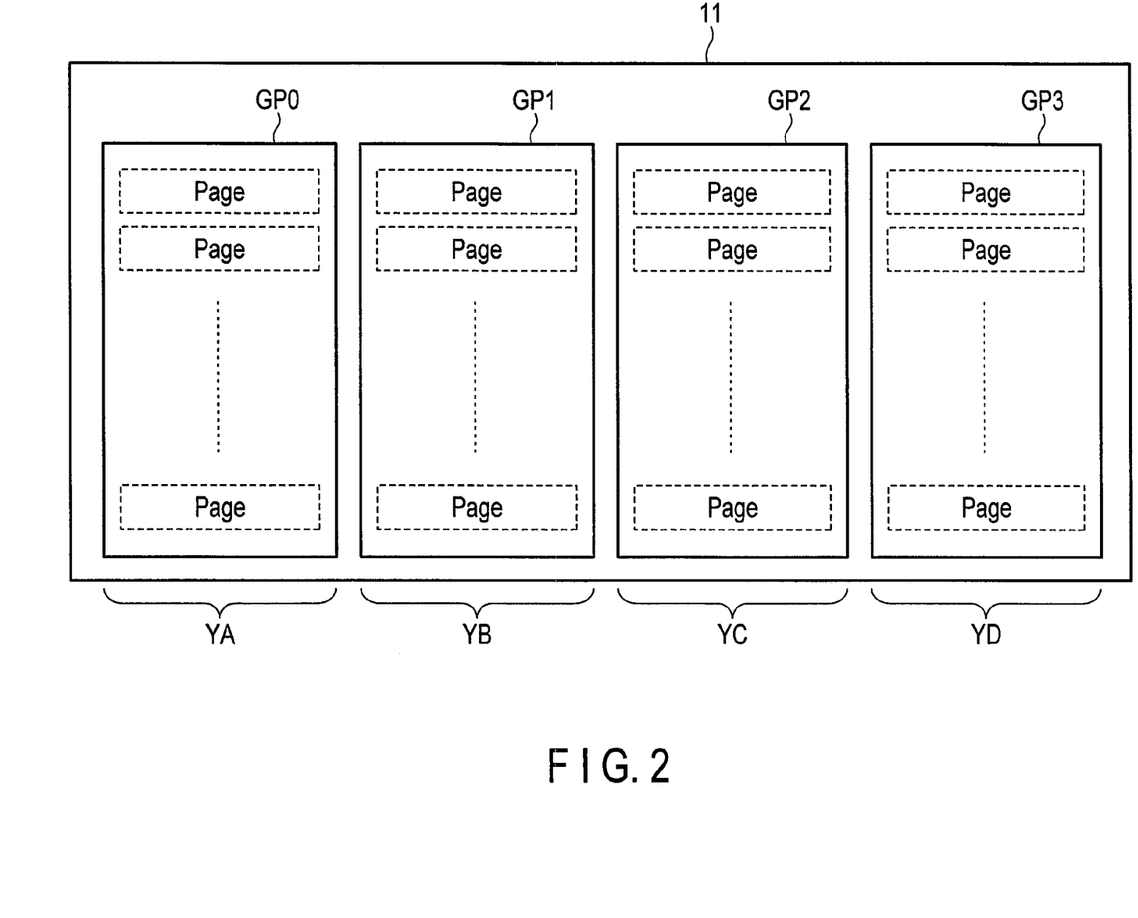
FIG. 2 is a block diagram of a memory cell array.

FIG. 2 is a block diagram of the memory cell array 11. The memory cell array 11 comprises a plurality of groups (GPs). In FIG. 2, four groups GP0 to GP3 are illustrated in FIG. 2 as an example. A write and read operation (interleaving and parallel processing) is performed separately for each group GP. In the following explanation, interleaving is performed in four columns YA to YD corresponding to the four groups GP0 to GP3 as an example; however, of course, the number of groups (and columns) is arbitrarily determinable. Each group GP has a plurality of pages.

Figure 3:
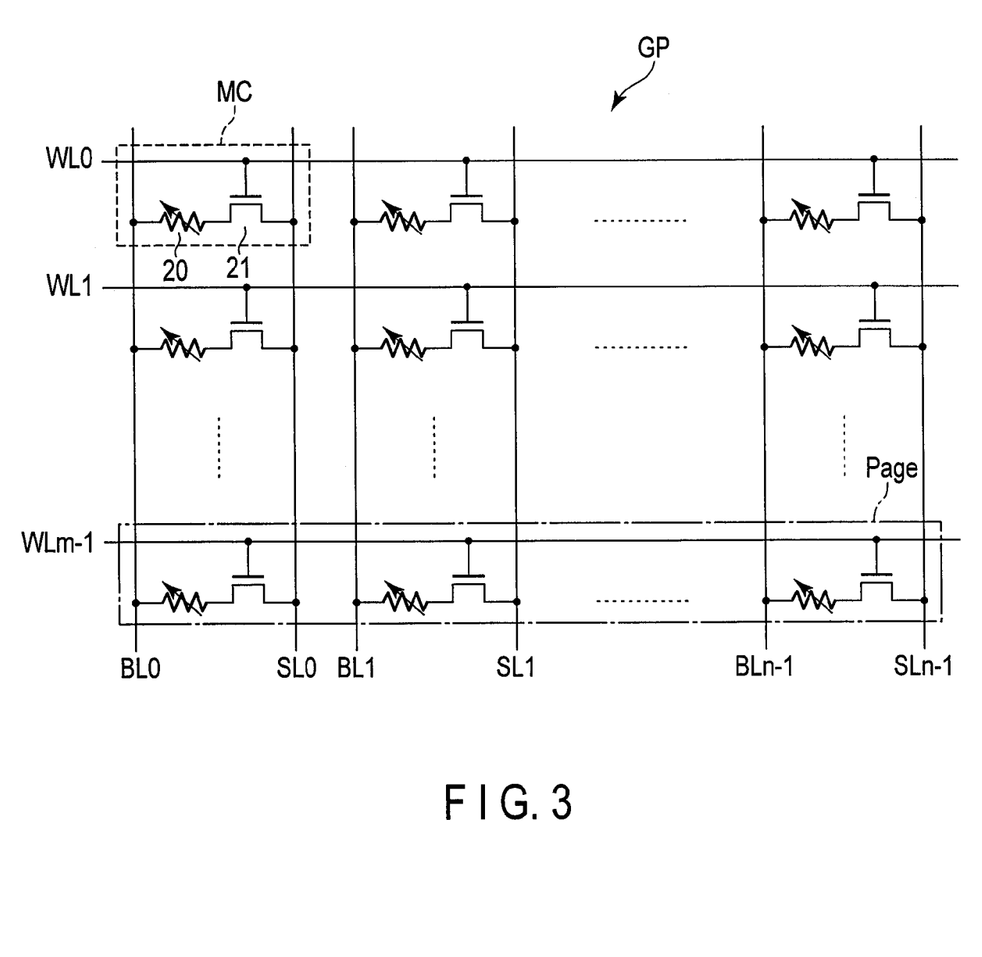
FIG. 3 is a circuitry diagram of a group included in the memory cell array.

FIG. 3 is a circuitry drawing of the group GP included in the memory cell array 11. The group GP is configured by arranging a plurality of memory cells MC in the form of a matrix. In the group GP, a plurality of word lines WL0 to WLm−1, a plurality of bit lines BL0 to BLn−1, and a plurality of source lines SL0 to SLn−1 are arranged. A word line WL is coupled to one row of a group GP, i.e., a memory cell group corresponding to one page, and a pair of one bit line BL and one source line SL are coupled to one column of the group GP. The word lines WL0 to WLm−1 are coupled in common to the groups GP0 to GP3.

The memory cell MC consists of a magnetic tunnel junction (MTJ) element 20 and a select transistor 21. The select transistor 21 is comprised of, for example, an N-channel MOSFET.

One end of the MTJ element 20 is connected to a bit line BL, and the other end is connected to the drain of the select transistor 21. The gate of the select transistor 21 is connected to a word line WL, and the source is connected to a source line SL.

In FIG. 1, the sense amplifier 13, the write buffer 14, the ECC circuit 15, and the page buffer 15 are provided in each of columns YA to YD. In the explanation hereinafter, if the following components of the MRAM, the sense amplifier 13, the write buffer 14, the ECC circuit 15, and/or the page buffer 16, appear, that means they are common among columns YA to YD; on the other hand, if it is necessary to distinguish the columns YA to YD, the column indicators YA to YD are added to those numbers of the components.

The row decoder 12 is connected to the plurality of word lines WL0 to WLm−1. The row decoder 12 selects one of the word lines based on a row address.

The sense amplifier 13 is connected to the plurality of bit lines BL0 to BLn−1. The sense amplifier 13, if a voltage detection scheme is adopted, compares a cell voltage applied to a selected memory cell with a reference voltage via a bit line BL to detect and amplify data in a selected memory cell. When the data is read, a source line is clamped to a grounding voltage VSS by the write buffer. The output from the write buffer to a bit line is set in a Hi-Z state (i.e., a high-impedance state) to avoid conflict with the operation of the sense amplifier.

The write buffer 14 is connected to the plurality of bit lines BL0 to BLn−1 and the plurality of source lines SL0 to SLn−1. The write buffer 14 writes the data to the selected memory cell via the bit line BL and the source line SL.

The ECC circuit 15 performs error detection and correction of the read data. The ECC circuit 15 generates an error correction code using write data when writing the data to the memory cell array, and adds the error correction code to the write data. The error correction code is written in a parity bit region of the memory cell array 11. The ECC circuit 15 performs error detection and correction using the error correction code read from the parity bit region when reading data from the memory cell array 11. Since it is unnecessary to output the error correction code to the outside of the MRAM, the error correction code is not read to the page buffer. To perform such process, the ECC circuit 15 has an ECC encoder and an ECC decoder.

The page buffer 15 stores the write data sent from the input/output interface circuit 17 and the read data sent from the ECC circuit 15. The page buffer 16 has a write page buffer to store the write data and a read page buffer to store the read data.

The input/output interface circuit 17 is coupled to an external circuit to perform inputting and outputting of data with the external circuit. The input/output interface circuit 17 sends data input from the external circuit to the page buffer 16 as write data, and outputs read data input from the page buffer 16 as output data.

The controller 17 integrally controls the operation of the MRAM 10. The controller 18 receives a clock CLK, an address (including a row address and a column address) and a command from the external circuit. The controller 18 supplies different control signals and voltages to the row decoder 12, the sense amplifier 13, the write buffer 14, the ECC circuit 15, the page buffer 16, and the input/output interface circuit 17 to control the operation of these circuits.

(Specific Example of Column-Related Peripheral Circuit)

Figure 4:
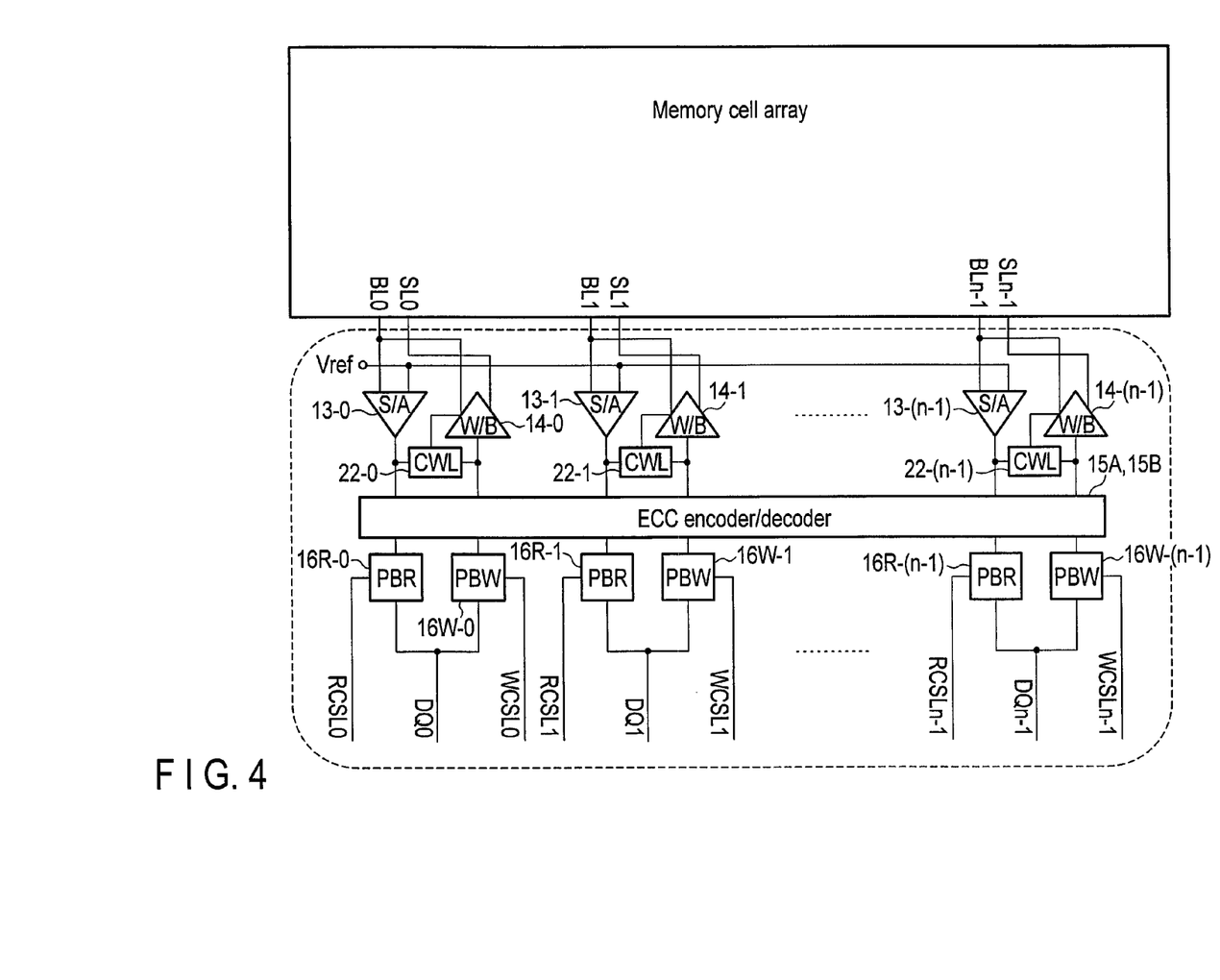
FIG. 4 is a block diagram that is focused on the column operation.

Next, a specific example of the configuration of column-related peripheral circuit is explained. FIG. 4 is a block diagram of a column-related peripheral circuit coupled to a group GP (one column) included in the memory cell array 11. In the explanation hereinafter, the circuit corresponding to the bit line BL0 and the source line SL0 will be explained. The circuit corresponding to the bit lines BL1 to BLn−1 and the source lines SL1 to SLn−1 is the same as the circuit corresponding to the bit line BL0 and the source line SL0.

The input of a write page buffer (PBW) 16W-0 is connected to a data line DQO, and the output of the write page buffer 16W-0 is connected to the ECC encoder 15A. The data line DQO is connected to the input/output interface circuit 17. The input of a write buffer (W/B) 14-0 is connected to the ECC encoder 15A, and two outputs of the write buffer W/B 14-0 are connected to the bit line BL0 and the source line SL0, respectively.

The input of a sense amplifier (S/A) 13-0 is connected to each of the bit line BL0 and a node to which a reference voltage Vref is applied. The output of the sense amplifier 13-0 is connected to the ECC decoder 15B. The input of a read page buffer (PBR) 16R-0 is connected to the ECC decoder 15B, and the output of the read page buffer 16R-0 is connected to the data line DQO.

The control terminal of the write page buffer 16W-0 is connected to a write column select line WCSL0. Activation or deactivation of the write page buffer 16W-0 is controlled based on a write column select signal sent from the controller 18 via a write column select line WCSL0. The control terminal of the read page buffer 16R-0 is connected to a read column select line RCSL0. Activation and deactivation of the read page buffer 16R-0 is controlled based on a read column select signal sent from the controller 18 via a read column select line RCSL0.

Furthermore, the output of the sense amplifier 13-0 and the input of the write buffer 14-0 are connected to a comparison write logic circuit (CWL) 22-0. The comparison write logic circuit 22-0 compares data stored in the sense amplifier 13-0 (raw data read from the memory cell) with data input to the write buffer 14-0 (the error-corrected data) and controls activation and deactivation of the write buffer 14-0 based on a result of the comparison.

(Structure of MTJ Element)

Figure 5:
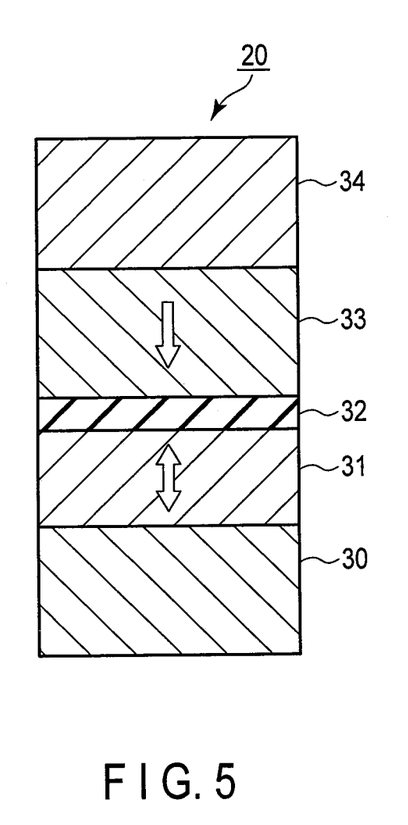
FIG. 5 is a sectional view of a magnetic tunnel junction (MTJ) element.

Next, an example of the structure of the MTJ element 20 is explained. FIG. 5 is a cross-sectional view of the MTJ element 20. The MTJ element 20 is formed by stacking a lower electrode 30, a memory layer (also called a magnetization free layer) 31, a nonmagnetic layer (tunnel barrier layer) 32, a reference layer (also called a magnetization fixed layer) 33, and an upper electrode layer 34, in this order. The memory layer 31 and the reference layer 33 are interchangeable in the stacking order.

Each of the memory layer 31 and the reference layer 33 is made of a ferromagnetic material. An insulating material, for example MgO, is used for the tunnel barrier layer 32.

Each of the memory layer 31 and the reference layer 33 has perpendicular magnetic anisotropy, and their easy magnetization axes are perpendicular. The magnetization of the memory layer 31 and the reference layer 33 may be in an in-plane direction.

The magnetization of the memory layer 31 can be variable (invertible). The magnetization of the reference layer 33 is invariable (fixed). The reference layer 33 is configured to have a perpendicular magnetic anisotropic energy sufficiently larger than that of the memory layer 31. The magnetic anisotropy can be determined by adjusting the composition of a material and a film thickness. By such adjustment, a magnetization switching current of the memory layer 31 is set small, and a magnetization switching current of the reference layer 33 is set greater than that of the memory layer 31. Thus, it is possible to realize the MTJ element 20 comprising the memory layer 31 and the reference layer 33 wherein the magnetization of the memory layer 31 is variable and the magnetization of the reference layer 33 is invariable with respect to a predetermined write current.

In the present embodiment, a write current directly flows through the MTJ element 20, and the write current is used to control the magnetization state of the MTJ element 20 based on a spin-transfer write scheme. The MTJ element 20 can have either low resistance or a high resistance in accordance with whether the magnetization relative relationship between the memory layer 31 and the reference layer 33 is parallel or antiparallel.

If a write current flows through the MTJ element 20 from the memory layer 31 to the reference layer 33, the magnetization relationship therebetween becomes parallel. If parallel, the resistance of the MTJ element 20 becomes the lowest, and thus, the MTJ element is set in a low-resistance state. Herein, the low-resistance state is defined as data "0," for example.

If a write current flows through the MTJ element 20 from the reference layer 33 to the memory layer 31, the magnetization relationship between the memory layer 31 and the reference layer 33 becomes antiparallel. If antiparallel, the resistance of the MTJ element 20 becomes the highest, and thus, the MTJ element 20 is set in a high-resistance state. Herein, the high-resistance state is defined as data "1," for example.

Thus, the MTJ element 20 can be used as a memory element that can store 1-bit data (binary data). The resistance state of the MTJ element 20 and the allocation of data is arbitrarily configurable.

If the data is read from the MTJ element 20, a read voltage is applied to the MTJ element 20 to detect the resistance of the MTJ element 20 based on a read current that flows through the MTJ element 20 when the voltage is applied. The read voltage is set sufficiently lower than a threshold voltage at which magnetization of the MTJ element 20 is inverted by spin transfer.

2. Operation

Figure 6:
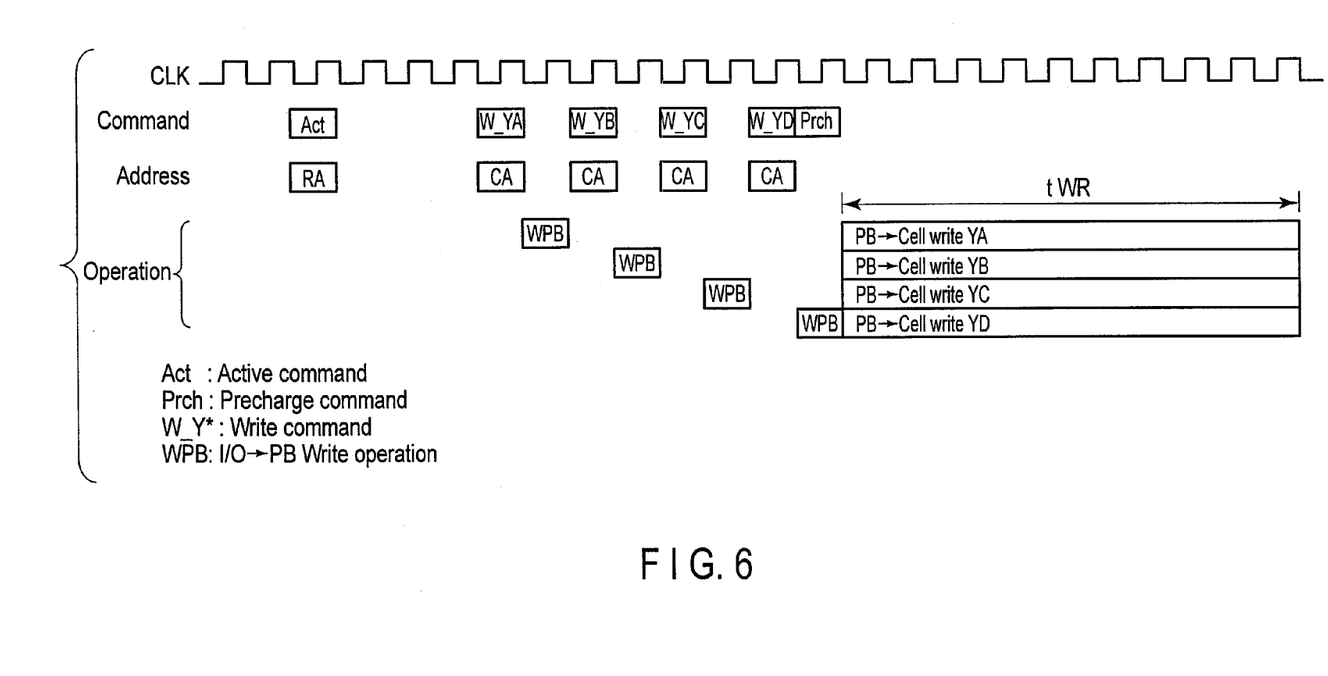
FIG. 6 is a timing chart illustrating a write operation in an MRAM according to the first embodiment.

The MRAM 10 configured as described above is explained. FIG. 6 is a timing chart indicating a write operation to the MRAM 10. In the explanation hereinafter, the timing control of the row decoder 12, the sense amplifier 13, the write buffer 14, the ECC circuit 16, the page buffer 16, and the input/output interface circuit 17 is carried out based on control signals generated by a controller 18. In response to a clock CLK sent from an external circuit, the controller 18 receives commands and addresses, and transmits and receives data.

First, the controller 18 receives an active command Act and a row address RA from the external circuit. The active command Act is a command for activating one of a plurality of word lines (a selected word line) in a selected bank to read data from the memory cell array 11 to the page buffer 16. In reality, one MRAM 10 shown in FIG. 1 corresponds to one bank, and a plurality of banks are implemented on a substrate to constitute a nonvolatile memory.

The controller 18 activates the selected word line based on the row address RA sent along with the active command Act. At almost the same time, the sense amplifier 13 is also activated to read data from a memory cell group connected to the selected word line. The data read from the memory cell array 11 in response to the active command Act is data corresponding to the pages of all columns YA to YD connected to the selected word line. The sense amplifier 13 holds the data read from the memory cell group until a precharge operation is completed in response to a precharge command Prch (described later).

Then, the ECC decoder 15B performs error correction on the read data sent from the sense amplifier 13 for each page, and the corrected data is held by the read page buffers 16R. The operation up to here is performed in response to the active command Act.

Then, the controller 18 receives a write command and a column address CA from the external circuit. In the write operation according to the present embodiment, the operation up to writing data input from the external circuit to the page buffer 16 via the input/output interface circuit 17, i.e., the operation indicated as WPB in FIG. 6, for each of columns YA to YD (groups GP0 to GP3) are interleaved. For example, as shown in FIG. 6, write commands W_YA to W_YD respectively corresponding to columns YA to YD, are input to the controller 18 sequentially from the external circuit.

The controller 18 writes data to column YA in response to write command W_YA. In other words, the controller 18 activates one or more of the write column select lines WCSL <0:n−1> based on column address CA sent along with write command W_YA.

Then, the input/output interface circuit 17 receives input data (write data) from the external circuit. The write data is written to the activated write page buffers 16W via the data lines DQ. After this, page data is written to the page buffer 16 (the read page buffer 16R and the write page buffer 16W) in response to each of write commands W_YB to W_YD in a manner similar to the writing in response to write command W_YA. At this point, write data used for the current write operation are all set to the page buffer 16.

Then, the controller 18 receives a precharge command Prch from the external circuit. The precharge command Prch is a command for setting a selected bank in an initial state (i.e., a precharge state) in order to start a read or write operation. More specifically, all the word lines, bit lines BL, and source lines SL are deactivated by the precharge command Prch. Furthermore, in the present embodiment, the precharge command Prch is used as a command indicating that the last write command of a series of write commands input during a write operation which is started by the active command Act has been input. Therefore, upon reception of the precharge command Prch, the controller 18 can realize that the write command received immediately before the precharge command is the last write command of a series of write commands beginning with the active command Act.

The controller 18 performs precharging in response to the precharge command Prch. Then, in parallel to column YA to YD, the controller 18 writes data from the page buffer 16 to the memory cell array 11 (a write back operation).

More specifically, in column YA, the ECC encoder 15A generates an error correction code for page data written to the page buffer 16_YA. The page data comprises the data written to the write page buffers 16W activated by the write column select lines WCSL and the data written to the read page buffers 16R activated by the read column select lines RCSL corresponding to the other bits. Then, the page data to which the error correction code is added is sent to the write buffer 14_YA.

Then, the comparison write logic circuit 22 compares the read data held by the sense amplifier 13_YA with the write data sent to the write buffer 14_YA. Then, the comparison write logic circuit 22 controls activation and deactivation of the write buffer 14_YA based on a result of the comparison. At this time, only when the read data held by the sense amplifier 13_YA does not match the write data sent to the write buffer 14_YA, the write buffer 14_YA corresponding to a bit that does not match is activated, and the activated write buffer 14_YA writes data to the memory cell. On the other hand, if those data match, data is not written to the memory cell. Thus, an unnecessary write operation can be omitted, thereby reducing current consumption. The writing to the memory cell array 11 for columns YB to YD is carried out in a manner similar to the writing for column YA.

The controller 18 determines that the writing from the page buffer 16 to the memory cell array 11 is completed after a write recovery time tWR has elapsed after receiving the precharge command Prch. The write recovery time tWR is a time required to complete writing data from the page buffer 16 to the memory cell array 11, and is determined in advance in accordance with a writing characteristic of the MRAM 10. For example, in the present embodiment, the controller 18 has a counter 18A to count a clock CLK. The controller 18 determines whether the write recovery time tWR elapses or not using the count by the counter 18A, and after the write recovery time tWR has elapsed, the write operation is completed.

Next, the read operation is explained. The process beginning with receiving an active command Act and ending with writing data in the page buffer 16 (the read page buffer 16R) in the read operation is identical to that of the write operation. In the example described herein, data in column YA is read.

The controller receives a read command and a column address from the external circuit. Next, the controller 18 activates one or more of a plurality of read column select lines RCSL <0:n−1> based on the column address. As a result, the read data is sent from the activated read page buffers 16R to the input/output interface circuit 17 via the data lines DQ. Then, the input/output interface circuit 17 outputs the read data to the external circuit.

In the read operation, the precharge command Prch is used as a command to indicate that the last read command in a series of read commands input during the read operation which is started by the active command Act was input. Similarly to the write operation, the controller 18 performs a write back operation from the page buffer 16 to the memory cell array 11 in parallel to column YA to YD in response to the precharge command Prch.

3. Effect

In the first embodiment, as described in details above, if write commands and/or read commands are input in series to the MRAM 10 which operates synchronously with a clock CLK, a command indicating the last write/read command i.e., a precharge command, is input immediately after the last write/read command, and the precharge command triggers a write back operation from the page buffer to the memory cell array.

Therefore, according to the first embodiment, write back operations from the page buffer to the memory cell array for a plurality of columns are not interleaved; rather, the write back operations are performed in parallel to the plurality of columns. Thus, the interleaving of a write back operation can be avoided, and thus, there is no need to configure a complicated column-related control logic. As a result, it becomes possible to make the configuration of a control circuit simple, thereby reducing a chip size.

Second Embodiment

In the second embodiment, when write commands designating the same column address are sequentially input to an external circuit, the write operation is carried out such that the write commands that precede the last write command are canceled.

Figure 7:
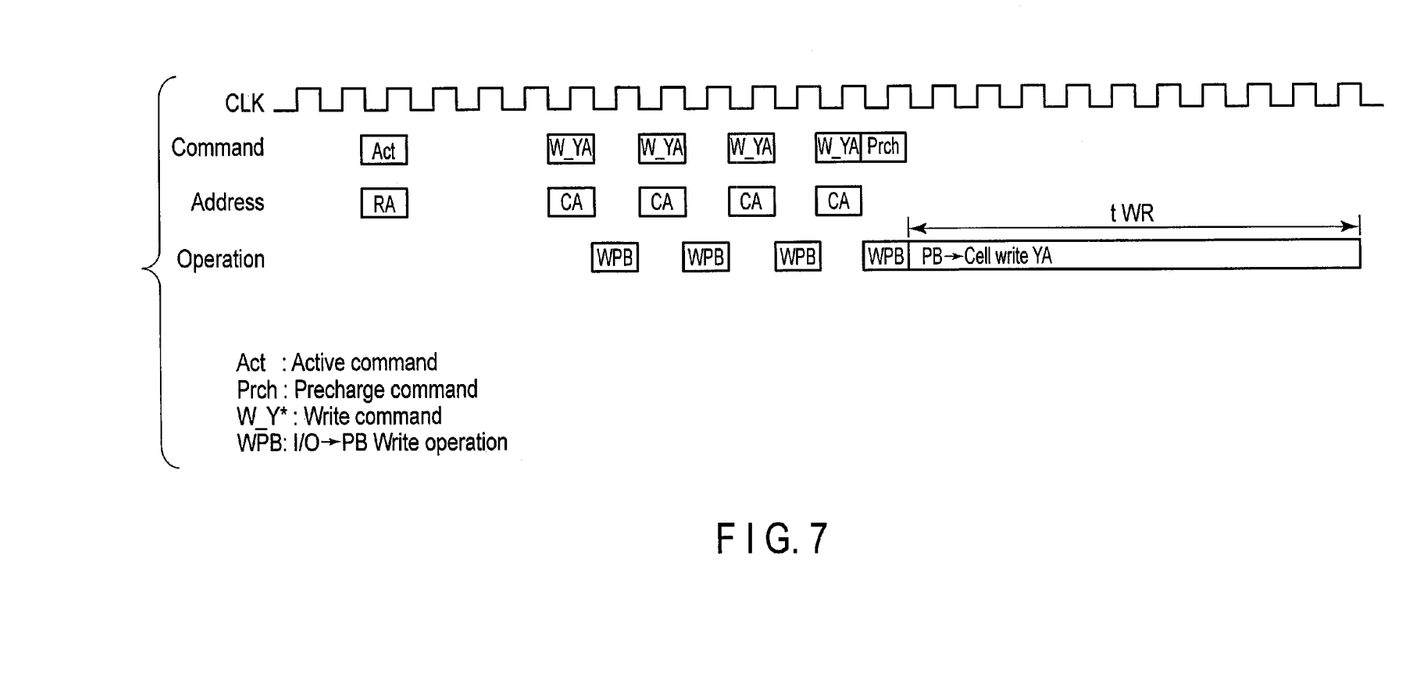
FIG. 7 is a timing chart illustrating a write operation in an MRAM according to the second embodiment.

FIG. 7 is a timing chart indicating the write operation to the MRAM 10 according to the second embodiment. In the write operation according to the second embodiment, the process beginning with receiving of an active command Act and ending with writing of data to the page buffer 16 (read page buffer 16R) is identical to that of the write operation according to the first embodiment. For example, write commands W_YA associated with a column YA are input sequentially from an external device.

The controller 18 receives a first write command W_YA and a column address CA from the external circuit, and the input/output interface circuit 17 receives input data (write data) from the external circuit. The write data is written to the write page buffers 16W activated by write column select lines WCSL via the data lines DQ. After this, in a similar manner, the second to fourth write commands W_YA are input, and writing from the input/output interface circuit 17 to the write page buffer 16W is performed in response to those write commands. The first to fourth write commands W_YA instruct a write operation to the same column. At this time, writing from the page buffer 16 to the memory cell array 11 is not performed.

Next, the controller 18 receives a precharge command Prch from the external circuit. Similar to the precharge command Prch in the first embodiment, this precharge command Prch is a command for setting a selected bank in an initial state (i.e., a precharge state) in order to start a read or write operation, and indicates that the last write command of a series of write commands has been input. Upon reception of the precharge command Prch, the controller 18 recognizes that the fourth write command W_YA is the last write command.

Next, the controller 18 cancels the write commands that precede the last write command, and performs writing from the page buffer 16 to the memory cell array 11 (a write back operation) only for the write data corresponding to the last write command. The write back operation for writing from the page buffer 16 to the memory cell array 11 is the same as that of the first embodiment.

As described in detail above, according to the second embodiment, it is possible to recognize the last write command in a plurality of sequential write commands designating the same column address, using a precharge command Prch. Then, the controller 18 performs a write back operation from the page buffer 16 to the memory cell array 11 only in response to the last write command. Thus, a write back operation is not performed for the plurality of sequential write commands designating the same column address except for the last write command, thereby negating a necessity of canceling a write back operation for the write commands that precede the last write command. As a result, the workload for the controller 18 can be reduced. In addition, no current is supplied to writing to the memory cell array 11 in response to the write commands except for the last write command, thereby reducing the power consumption of the MRAM 10.

Third Embodiment

In the third embodiment, a first command indicating the last write command and a second command indicating an end point where writing from the page buffer 16 to the memory cell array 11 (a write back operation) ends are newly prepared (defined). The first and second commands are used to perform a write back operation according to the third embodiment.

Figure 8:
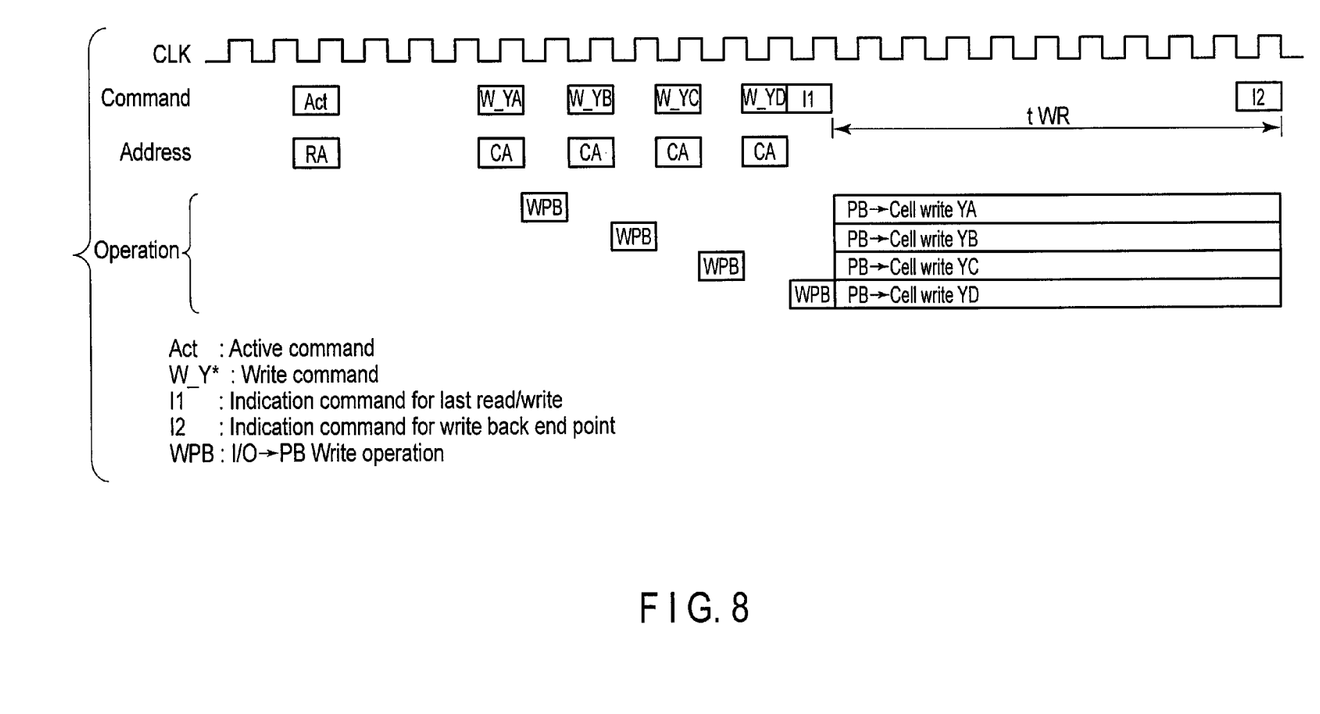
FIG. 8 is a timing chart illustrating a write operation in an MRAM according to the third embodiment.

FIG. 8 is a timing chart illustrating the write operation to the MRAM 10 according to the third embodiment. For example, as shown in FIG. 8, the write commands W_YA to W_YD respectively corresponding to column YA to YD are sequentially input to the controller 18 from the external circuit. In the write operation according to the third embodiment, the process beginning with receiving of an active command Act and ending with writing of data associated with the write commands W_YA to W_YD to the page buffer 16 is identical to that of the write operation according to the first embodiment.

After receiving the write command W_YD, the controller 18 receives an indication command I1 from the external circuit. The indication command I1 is a command indicating that the last write command of a series of write commands sequentially input during the write operation which is started by the active command Act has been input. Upon reception of the indication command I1, the controller 18 recognizes that the write command received immediately before the indication command I1 is the last write command of the series of write commands that have been input immediately after the active command Act.

Next, the controller 18 writes data from the page buffer 16 to the memory cell array 11 in parallel to columns YA to YD (a write back operation). This write back operation is the same as that of the first embodiment.

Next, the controller 18 receives an indication command I2 from the external device. The indication command I2 is a command that indicates an end point where a write back operation from the page buffer 16 to the memory cell array 11 ends. The time between reception of the indication command I1 and reception of the indication command I2 is a write recovery time tWR. Upon reception of the indication command I2, the controller 18 ends the write operation. A precharge command Prch that is input from the external circuit to the controller 18 at the same timing as the indication command I2 may act as the indication command I2.

In a read operation, similarly to a write operation, the precharge command Prch indicates the last read command, and then, a write back operation is performed.

As described in detail above, the same advantageous effect as that of the first embodiment can be achieved in the third embodiment.

Fourth Embodiment

In the fourth embodiment, the indication command I1 indicating the last write command and the indication command I2 indicating an end point where a write back operation from the page buffer 16 to the memory cell array 11 ends are applied to the write operation in which sequential write commands designating the same column are input from the external circuit and the write commands that precede the last write command are canceled (this is the same as in the second embodiment).

Figure 9:
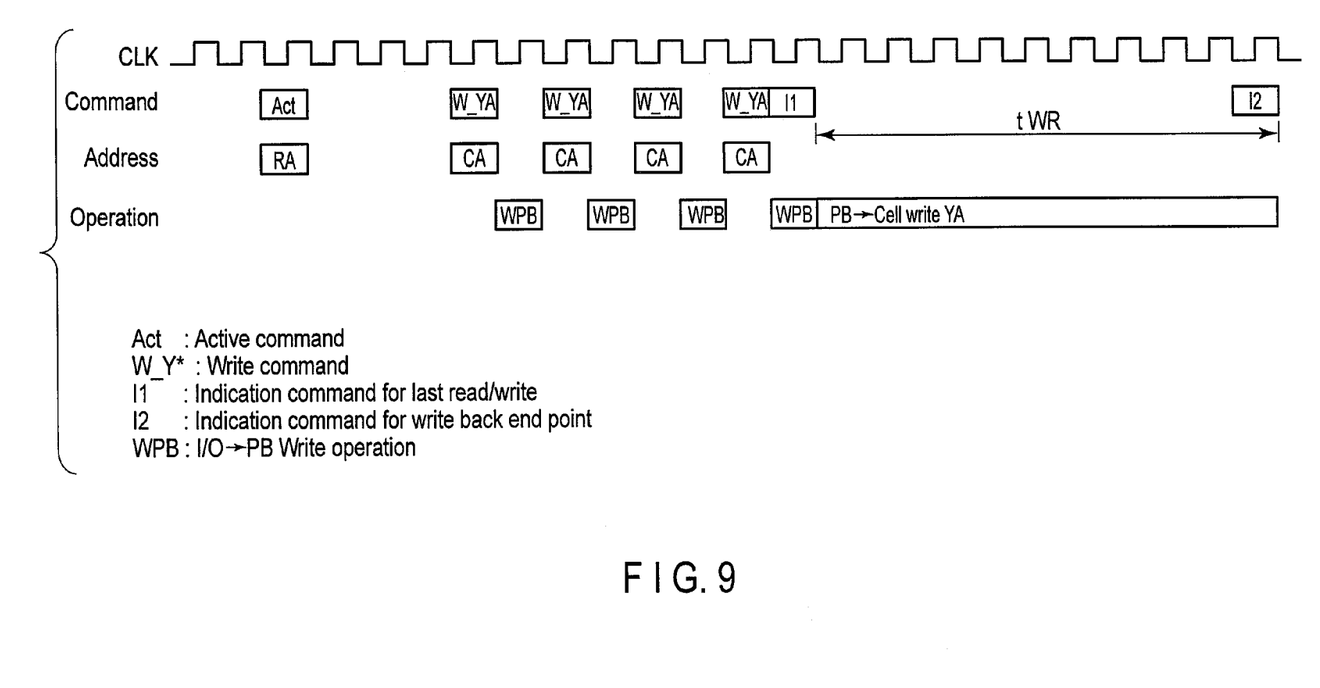
FIG. 9 is a timing chart illustrating a write operation in an MRAM according to the fourth embodiment.

FIG. 9 is a timing chart illustrating the write operation to the MRAM 10 according to the fourth embodiment. In the write operation according to the fourth embodiment, the process beginning with receiving an active command Act and ending with writing of data in the page buffer 16 (read page buffer 16R) is the same as that of the write operation according to the first embodiment. For example, suppose the write commands W_YA designating the column YA are input sequentially from an external circuit.

The controller 18 receives a first write command W_YA and a column address CA from the external device, and the input/output interface circuit 17 receives input data (write data) from the external device. The write data is written to the write page buffers 16W activated by the write column select lines WCSL via the data lines DQ. Then, in a similar manner, the second to fourth write commands W_YA are input, and the write operation from the input/output interface circuit 17 to the write page buffers 16W is performed in response to those write commands. The first to fourth write commands W_YA designate the same column address. At this time, a write operation from the page buffer 16 to the memory cell array 11 is not performed.

Next, the controller 18 receives an indication command I1 from the external device. Upon reception of the indication command I1, the controller 18 recognizes the write command immediately before the indication command I1 is the last write command of the series of write commands beginning with the active command Act. Next, the controller 18 cancels the write commands that precede the last write command, and performs a write back operation from the page buffer 16 to the memory cell array 11 only for the write data corresponding to the last write command. The write back operation from the page buffer 16 to the memory cell array 11 is the same as that of the first embodiment.

As described in detail above, according to the fourth embodiment, the same advantageous effect as that of the second embodiment can be achieved.

In all the embodiments described above, a case where only write commands are input sequentially was mainly explained; however, it is of course effective to input a command that indicates the last write or read command and perform a write back operation in a case where both of write commands and read commands are input, or only read commands are input.

Figure 10:
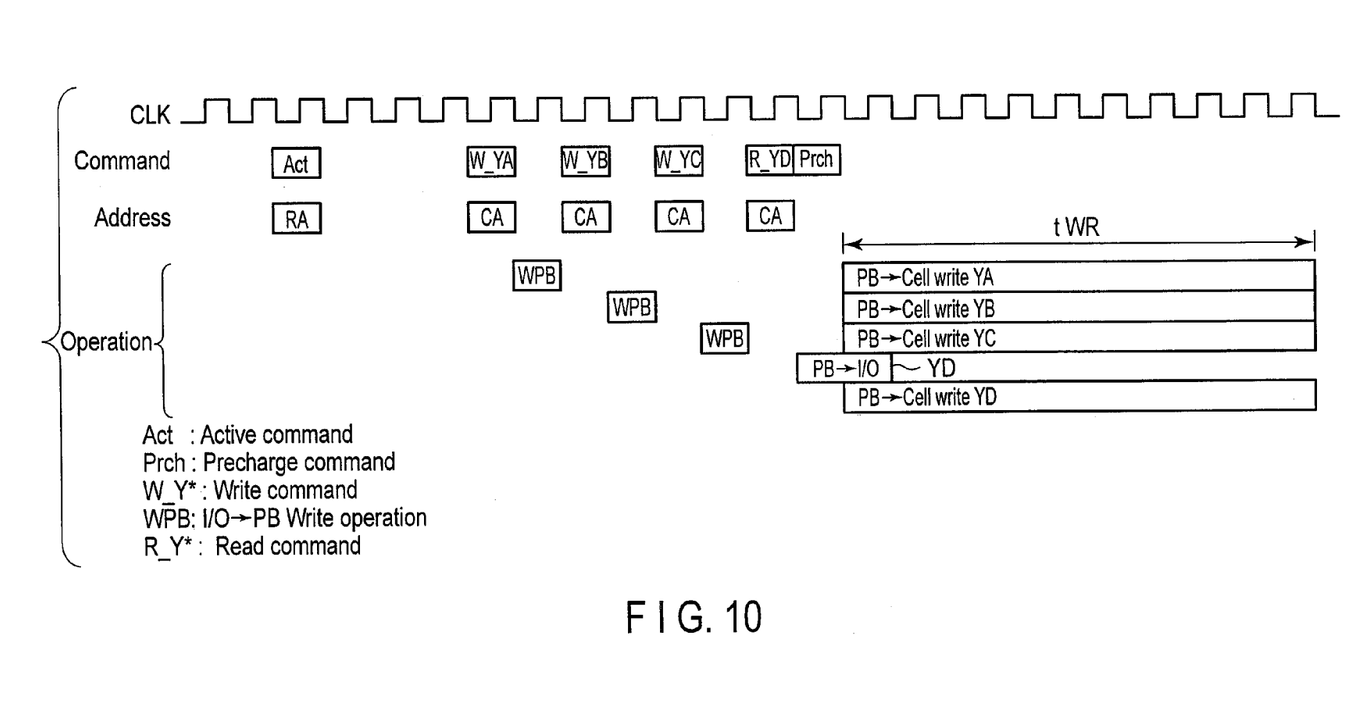
FIG. 10 is a timing chart illustrating an operation in which mixed commands including read commands and write commands are sequentially input to an MRAM.

FIG. 10 is a timing chart illustrating a read operation from the MRAM 10 according to a variation. In the variation shown in FIG. 10, the fourth write command W_YD in the operation according to the first embodiment (FIG. 6) is changed to the read command R_YD. The read command R_YD is a read request to column YD.

Since there is no access to the bank after the read command R_YD, it is desirable to perform a precharge operation, such as deactivation of a word line. Accordingly, at this point, it is necessary to start a write back operation from a page buffer to a memory cell array. Thus, a command indicating the last read or write command is input immediately after the read command (in FIG. 10, the precharge command is a command indicating the last read or write command, since the example shown in FIG. 10 is based on the first embodiment). Then, in order to write data obtained from the external circuit to a memory cell, at each of columns YA, YB and YC, the ECC encoder calculates an error correction code to add to the write data, and a rewrite operation to a memory cell is performed.

At column YD, a read operation is performed. If a retention error of a memory cell or read disturb error occurs at column YD, error correction is performed by ECC, and a write back operation is performed again to reflect a result of the error correction to the memory cell.

The timing chart used in this variation is an application of the first embodiment. It is effective in the second to fourth embodiments to input a command designating the last read or write command not only in a case of a write operation in response to sequential write commands but also in a case where both of read commands and write commands are input or where only read commands are input.

Each of the embodiments described above was explained using an MRAM using a magnetoresistive effect element as a semiconductor memory device; however, a semiconductor memory device is of course not limited to an MRAM. Each of the embodiments is applicable to a volatile memory, a non-volatile memory or various semiconductor memory devices. The technology disclosed in each embodiment is effective for semiconductor memory devices in general, particularly those using a memory cell that requires a relatively long time for writing. Each of the embodiments is also applicable to a resistance-change memory similar to an MRAM, such as a resistive random access memory (ReRAM) or phase-change random access memory (PCRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array comprising memory cells;
   word lines coupled to rows of the memory cell array;
   bit lines coupled to columns of the memory cell array;
   an input/output circuit configured to receive data from the outside and to output data to the outside;
   a buffer configured to hold data input to the input/output circuit and to hold data read from the memory cell array via the bit lines; and
   a controller configured to receive a first command and an address from the outside and to read data, in response to the first command, from a memory cell group coupled to a selected word line designated by the address to the buffer,
   wherein the controller receives a second command which is input after the first command and indicates a last command of a group of commands including write commands and/or read commands, and
   the controller starts a write operation from the buffer to the memory cell array in response to the second command.

2. The device of claim 1, wherein the second command is a precharge command to deactivate the word lines and the bit lines.

3. The device of claim 1, wherein
   the group of commands includes write commands, and
   the controller does not perform a write operation in which data is written from the buffer to the memory cell array in all write commands except for a last write command if the write commands instructs a write operation to the same column.

4. The device of claim 1, wherein the controller ends the write operation when receiving a third command indicating a write operation from the buffer to the memory cell array is completed.

5. The device of claim 4, wherein the third command is a precharge command to deactivate the word lines and the bit lines.

6. The device of claim 1, wherein
   the controller measures a time elapsed since the reception of the second command, and
   the controller determines that a write operation from the buffer to the memory cell array is completed if the measured time reaches a predetermined time.

7. The device of claim 6, further comprising a counter configured to count a clock,
   wherein the controller determines whether the measured time reaches the predetermined time using a count by the counter.

8. The device of claim 1, wherein
   the memory cell array comprises groups each comprising memory cells, and
   the controller performs write operations from the buffer to the memory cell array for the groups in parallel.

9. The device of claim 1, wherein
   the memory cell array comprises groups each comprising memory cells, and
   the controller interleaves data-transfer operations from the input/output circuit to the buffer for the groups.

10. The device of claim 1, wherein the controller writes, to the memory cell array, the data held by the buffer from the input/output circuit in response to the write command.

11. The device of claim 1, wherein the controller rewrites, to the memory cell array, the data held by the buffer from the memory cell array in response to the read command.

12. The device of claim 1, further comprising:
    a read circuit configured to read data from the memory cell array;
    a correction circuit configured to perform error correction on data read by the read circuit; and
    a write circuit configured to write the data held by the buffer to the memory cell array.

13. The device of claim 1, wherein each of the memory cells includes a magnetoresistive effect element.

* * * * *